United States Patent
Liu et al.

(10) Patent No.: US 11,864,326 B2
(45) Date of Patent: Jan. 2, 2024

(54) SUBSTRATE, MAINTENANCE METHOD AND DISPLAY DEVICE

(71) Applicants: Chongqing BOE Optoelectronics Technology Co., Ltd., Chongqing (CN); BOE Technology Group Co., Ltd., Beijing (CN)

(72) Inventors: Hongda Liu, Beijing (CN); Zhijun Xu, Beijing (CN); Rui Chen, Beijing (CN); Yue Cao, Beijing (CN); Yajun Wang, Beijing (CN); Yong Xiong, Beijing (CN)

(73) Assignees: Chongqing BOE Optoelectronics Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/760,971

(22) PCT Filed: May 19, 2021

(86) PCT No.: PCT/CN2021/094516
§ 371 (c)(1),
(2) Date: Mar. 16, 2022

(87) PCT Pub. No.: WO2022/001444
PCT Pub. Date: Jan. 6, 2022

(65) Prior Publication Data
US 2022/0346237 A1  Oct. 27, 2022

(30) Foreign Application Priority Data
Jun. 28, 2020 (CN) .......................... 202010597610.X

(51) Int. Cl.
*H05K 3/22* (2006.01)
*G06F 3/041* (2006.01)
(Continued)

(52) U.S. Cl.
CPC ............. *H05K 3/225* (2013.01); *G06F 3/044* (2013.01); *G06F 3/0412* (2013.01); *H05K 3/107* (2013.01);
(Continued)

(58) Field of Classification Search
CPC .......... H05K 3/225; H05K 3/107; H05K 3/28; G06F 3/0412; G06F 3/044; G06F 2203/04103
See application file for complete search history.

(56) References Cited

U.S. PATENT DOCUMENTS 5,153,408 A * 10/1992 Handford .......... H01L 21/76892
338/195
10,276,603 B2   4/2019 Wang et al.
(Continued)

FOREIGN PATENT DOCUMENTS

CN   101051642 A   10/2007
CN   104503112 A   4/2015
(Continued)

OTHER PUBLICATIONS

Jian et al., CN 110928087 A machine translation (Year: 2019).*
PCT/CN2021/094516 international search report and written opinion.

*Primary Examiner* — Peter D McLoone
(74) *Attorney, Agent, or Firm* — IPro, PLLC

(57) ABSTRACT

The present disclosure provides a substrate, a maintenance method thereof and a display device. The substrate includes a base substrate, the base substrate is provided with at least one conductive pattern, and at least one of the at least one conductive pattern is interrupted and divided into a first conductive sub-pattern and a second conductive sub-pattern. The maintenance method includes: coating a conductive material in an interruption region in such a manner as to cover both the first conductive sub-pattern and the second (Continued)

conductive sub-pattern; and coating an organic insulation material at a side of the conductive material away from the base substrate, and curing the organic insulation material to form an organic protection film covering the conductive material.

18 Claims, 4 Drawing Sheets

(51) Int. Cl.
    *G06F 3/044* (2006.01)
    *H05K 3/10* (2006.01)
    *H05K 3/28* (2006.01)

(52) U.S. Cl.
    CPC ..... *H05K 3/28* (2013.01); *G06F 2203/04103* (2013.01)

(56) References Cited

U.S. PATENT DOCUMENTS

| | | |
|---|---|---|
| 2005/0142669 A1 | 6/2005 | Chen et al. |
| 2018/0294289 A1* | 10/2018 | Wang ................. H01L 27/1244 |
| 2019/0004382 A1 | 1/2019 | Ren et al. |
| 2020/0365458 A1 | 11/2020 | Xu et al. |

FOREIGN PATENT DOCUMENTS

| | | |
|---|---|---|
| CN | 104849926 A | 8/2015 |
| CN | 107145019 A | 9/2017 |
| CN | 109240006 A | 1/2019 |
| CN | 109901742 A | 6/2019 |
| CN | 110928087 A | 3/2020 |
| KR | 20060057308 A | 5/2006 |
| KR | 101034959 B1 | 5/2011 |
| WO | 2019206124 A1 | 10/2019 |

* cited by examiner

# US 11,864,326 B2

SUBSTRATE, MAINTENANCE METHOD AND DISPLAY DEVICE

CROSS-REFERENCE TO RELATED APPLICATION

This application is the U.S. national phase of PCT Application No. PCT/CN2021/094516 filed on May 19, 2021, which claims a priority of the Chinese patent application No. 202010597610.X filed on Jun. 28, 2020, which is incorporated herein by reference in its entirety.

TECHNICAL FIELD

The present disclosure relates to the field of display technology, in particular to a substrate, a maintenance method thereof and a display device.

BACKGROUND

In a conventional touch display panel, a touch electrode is formed on a surface of the display panel to achieve a touch function, and defects caused by a manufacturing process mainly include an open circuit and a short circuit. For the short circuit, a short-circuit point is cut off through laser for the subsequent maintenance. For the open circuit, most of the touch electrodes are made of indium tin oxide (ITO). Due to ITO particularity, metal at a maintenance point will fall off in a reliability verification process when a metal direct connection maintenance method is adopted, so a maintenance effect may be adversely affected.

SUMMARY

An object of the present disclosure is to provide a substrate, a maintenance method thereof and a display device, so as to improve the yield of the substrate.

The present disclosure provides the following technical solutions.

In one aspect, the present disclosure provides in some embodiments a maintenance method for a substrate. The substrate includes a base substrate, the base substrate is provided with at least one conductive pattern, and at least one of the at least one conductive pattern is interrupted and divided into a first conductive sub-pattern and a second conductive sub-pattern. The maintenance method includes: coating a conductive material in an interruption region in such a manner as to cover both the first conductive sub-pattern and the second conductive sub-pattern; and coating an organic insulation material at a side of the conductive material away from the base substrate, and curing the organic insulation material to form an organic protection film covering the conductive material.

In a possible embodiment of the present disclosure, prior to coating the conductive material in the interruption region, the maintenance method further includes forming a groove in a surface of the substrate in the interruption region, and the groove extends from the first conductive sub-pattern to the second conductive sub-pattern. The coating the conductive material in the interruption region includes filling the groove with the conductive material.

In a possible embodiment of the present disclosure, prior to coating the conductive material in the interruption region, the maintenance method further includes removing foreign matters in the interruption region.

In another aspect, the present disclosure provides in some embodiments a substrate including a base substrate. The base substrate is provided with at least one conductive pattern, and at least one of the at least one conductive pattern is interrupted and divided into a first conductive sub-pattern and a second conductive sub-pattern. The substrate further includes: a conductive material in an interruption region and covering both the first conductive sub-pattern and the second conductive sub-pattern; and an organic protection film at a side of the conductive material away from the base substrate.

In a possible embodiment of the present disclosure, an orthogonal projection of the conductive material onto the base substrate is arranged within an orthogonal projection of the organic protection film onto the base substrate.

In a possible embodiment of the present disclosure, the organic protection film is of a circular shape, and a diameter of the organic protection film is 70 µm to 100 µm.

In a possible embodiment of the present disclosure, a first orthogonal projection of the interruption region onto the base substrate is arranged within a second orthogonal projection of the conductive material onto the base substrate.

In a possible embodiment of the present disclosure, a shortest distance between an outline of the first orthogonal projection and an outline of the second orthogonal projection is greater than 2 µm.

In a possible embodiment of the present disclosure, a surface of the conductive material away from the base substrate and a surface of the conductive pattern away from the base substrate are located on a same plane.

In a possible embodiment of the present disclosure, the substrate further includes a groove extending from the first conductive sub-pattern to the second conductive sub-pattern, and the conductive material is filled in the groove.

In a possible embodiment of the present disclosure, an orthogonal projection of the groove onto the base substrate is a radial pattern.

In a possible embodiment of the present disclosure, the conductive pattern is made of a transparent conductive material, and the conductive material is tungsten powder, silver powder, or cobalt powder.

In a possible embodiment of the present disclosure, the substrate is a touch substrate, and the conductive pattern is a touch electrode line.

In yet another aspect, the present disclosure further provides in some embodiments a display device including the above-mentioned substrate.

Figure 1:
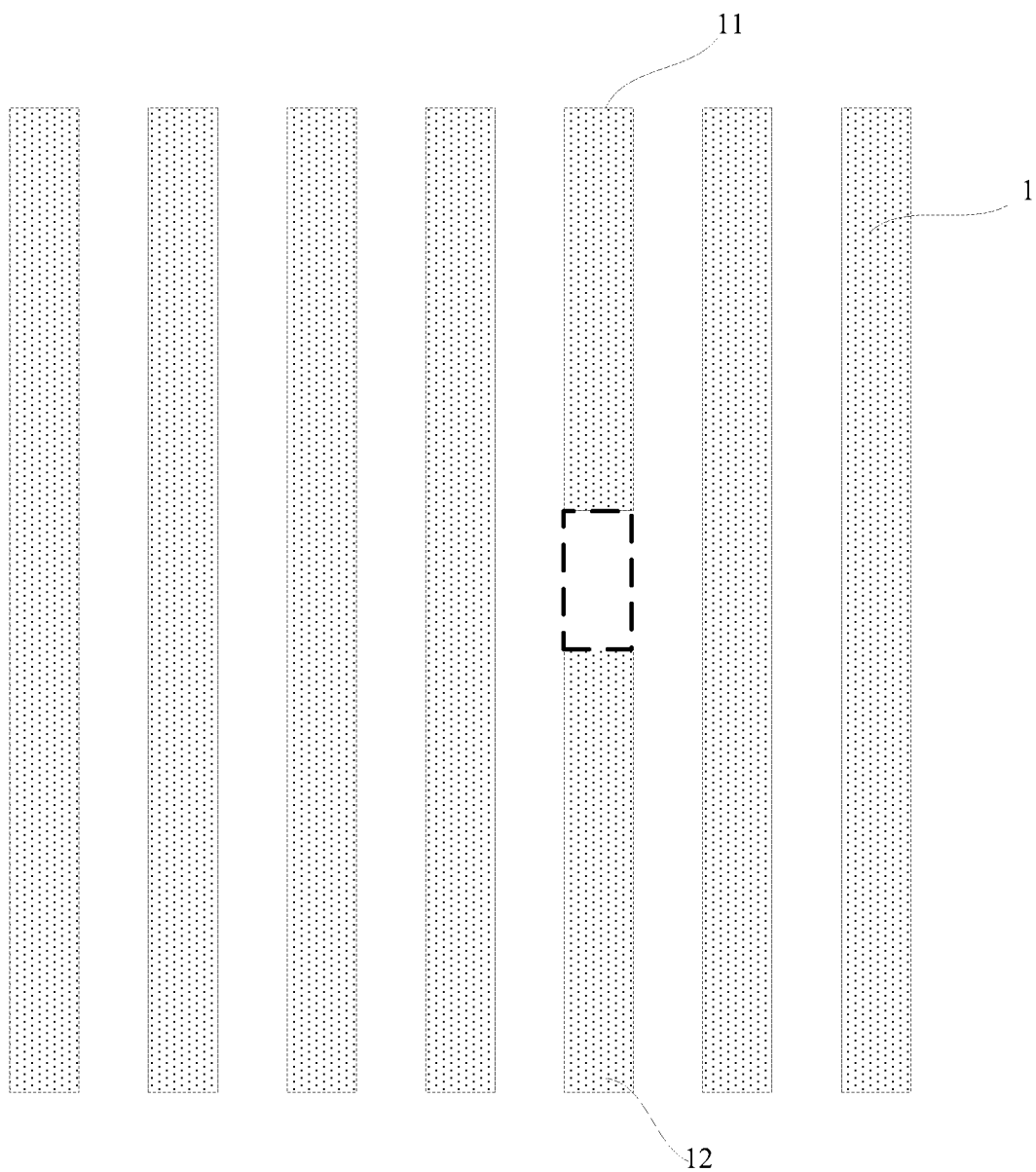
FIG. 1 is a schematic view showing a situation where a conductive pattern is interrupted in the related art.

REFERENCE SIGN LIST 1 touch electrode line
11 first conductive sub-pattern
12 second conductive sub-pattern
2 groove
3 conductive material
4 organic protection film

DETAILED DESCRIPTION

In order to make the objects, the technical solutions and the advantages of the present disclosure more apparent, the present disclosure will be described hereinafter in a clear and complete manner in conjunction with the drawings and embodiments.

An object of the present disclosure is to provide a substrate, a maintenance method thereof and a display device, so as to improve the yield of the substrate.

The present disclosure provides in some embodiments a maintenance method for a substrate. The substrate includes a base substrate, the base substrate is provided with at least one conductive pattern, and at least one of the at least one conductive pattern is interrupted and divided into a first conductive sub-pattern and a second conductive sub-pattern. The maintenance method includes: coating a conductive material in an interruption region in such a manner as to cover both the first conductive sub-pattern and the second conductive sub-pattern; and coating an organic insulation material at a side of the conductive material away from the base substrate, and curing the organic insulation material to form an organic protection film covering the conductive material.

According to the embodiments of the present disclosure, when the conductive pattern is interrupted, the conductive material is coated in the interrupted region so as to enable the divided parts of the conductive pattern to be electrically coupled to each other. In addition, the organic insulation material is coated at one side of the conductive material away from the base substrate, and then cured to form the organic protection film covering the conductive material. The organic protection film has stronger adhesion with the base substrate, so it is able to prevent the conductive material from falling off from the base substrate in a reliability verification process, thereby to ensure a maintenance effect and improve the yield of the substrate.

In some embodiments of the present disclosure, the conductive pattern of the substrate is made of a transparent conductive material, such as ITO. Usually, the conductive material for maintaining the interruption region is metal powder, such as tungsten powder. Due to poor bondability between ITO and the metal powder, after the maintenance is performed in interruption region through the metal powder, the metal may fall off at a maintenance point, and thereby the yield of the substrate may be adversely affected. In the embodiments of the present disclosure, the conductive material is covered by the organic protection film having strong adhesion with the base substrate, so it is able to prevent the metal at the maintenance point falling off from the base substrate, thereby to ensure the maintenance effect and improve the yield of the substrate.

The organic insulation material may be organic resin, and the conductive material for maintenance may be tungsten powder, silver powder, or cobalt powder. As compared with the conductive material, the organic insulation material has stronger adhesion with the base substrate and is not easy to fall off from the base substrate, so it is able to prevent the conductive material from falling off from the base substrate.

In addition, when there are foreign matters, such as residual conductive patterns, in the interruption region, the adhesion between the conductive material and the base substrate is reduced, and a risk that the conductive material falls off from the base substrate is increased. Hence, prior to coating the conductive material in the interruption region, the maintenance method further includes removing the foreign matters in the interruption region, and the foreign matters includes residual conductive patterns or impurity particles. In this way, it is able to uniformly coat the conductive material on the base substrate, and increase the adhesion between the conductive material and the substrate, thereby to reduce the risk that the conductive material falls off from the base substrate. To be specific, the foreign matters may be removed in the interruption region through laser. Due to high precision of the laser, it is able to accurately remove the foreign matters in the interruption region without adversely affecting the other regions.

In addition, the larger the contact area between the conductive material and the substrate, the greater the adhesion between the conductive material and the substrate. In order to improve the adhesion between the conductive material and the substrate, the conductive material may be coated in such a manner as to cover a larger area of the substrate. Hence, prior to coating the conductive material in the interruption region, the maintenance method further includes form a groove in a surface of the substrate in the interruption region. The coating the conductive material in the interruption region includes filling the groove with the conductive material. Due to the groove, it is able to increase the contact area between the conductive material and the substrate, so as to increase the adhesion between the conductive material and the substrate and ensure the bonding stability between the conductive material and the conductive pattern, thereby to prevent the conductive material from falling off from the base substrate due to different thermal expansion coefficients of the conductive material and the conductive pattern.

The groove extends from the first conductive sub-pattern to the second conductive sub-pattern, i.e., an orthogonal projection of the groove onto the base substrate overlaps an orthogonal projection of the first conductive sub-pattern onto the base substrate and an orthogonal projection of the second conductive sub-pattern onto the substrate. In order to increase an area of the groove and further increase the contact area between the conductive material and the substrate, the orthogonal projection of the groove onto the base substrate is a radial pattern, for example, a cross-shaped or a star-like pattern.

A width of the groove is adjusted in accordance with a line width of the conductive pattern, e.g., one third of the line width of the conductive pattern. When the width of the conductive pattern is relatively large, a plurality of parallel or crossed grooves may be formed, and each groove extends from the first conductive sub-pattern to the second conductive sub-pattern.

Subsequent to the formation of the groove in the base substrate, the groove may be filled with the conductive material to couple the first conductive sub-pattern and the second conductive sub-pattern, and a surface of the conductive material away from the base substrate and a surface of the conductive pattern away from the base substrate are located on a same plane. In this regard, after maintaining the conductive pattern through the conductive material, the surface of the conductive material away from the base substrate and the surface of the conductive pattern away from the base substrate may form a flat surface, so as to facilaite the subsequent process.

In order to increase the contact area between the conductive material and the base substrate as possible, the conductive material, in addition to covering the interruption region, should also exceed the interruption region, i.e., a first orthogonal projection of the interruption region onto the base substrate is arranged within a second orthogonal projection of the conductive material onto the base substrate. In some embodiments of the present disclosure, a shortest distance between an outline of the first orthogonal projection and an outline of the second orthogonal projection is greater than 2 µm, so as to ensure a sufficient contact area between the conductive material and the base substrate, thereby to prevent the conductive material from falling off from the base substrate.

In the embodiments of the present disclosure, the organic protection film is used to prevent the conductive material from falling off from the base substrate, and in order to achieve the purpose, an orthogonal projection of the conductive material onto the base substrate should be arranged within an orthogonal projection of the organic protection film onto the base substrate. Subsequent to coating the conductive material to couple the first conductive sub-pattern and the second conductive sub-pattern, an organic protection liquid material is coated on the conductive material. The organic protection liquid material is subjected to ultraviolet curing and then thermal curing to form the organic protection film. In this way, it is able to firmly bond the organic protection film to the base substrate and prevent the conductive material from falling off from the base substrate, thereby to increase the maintenance stability. The thermal curing is performed at a temperature of 120° C. for about 60 minutes. Of course, in the embodiments of the present disclosure, the thermal curing is not limited to be performed at a temperature of 120° C. for 60 minutes, and any other process parameters may be also adopted.

A thickness of the organic protection film is less than 1.5 µm, so as to prevent the subsequent process, e.g., the attachment of a polarizer, from being adversely affected.

An upper limit of an area of the organic protection film is determined so as to not affect an appearance of the substrate. In some embodiments of the present disclosure, the organic protection film is of a circular shape, and a diameter of the organic protection film is 70 µm to 100 µm. When the diameter of the organic protection film has the above value, the organic protection film may completely cover the maintenance region without affecting the appearance of the substrate.

In the embodiments of the present disclosure, the substrate is a display substrate or a touch substrate. The conductive pattern is an electrode of the substrate or a signal line of the substrate.

When the conductive pattern is made of a transparent conductive material, such as ITO, due to the particularity of the transparent conductive material, metal will fall off when the maintenance is performed in the interruption region. However, when the method in the embodiments of the present disclosure, it is able to solve the above-mentioned problem.

Figure 2:
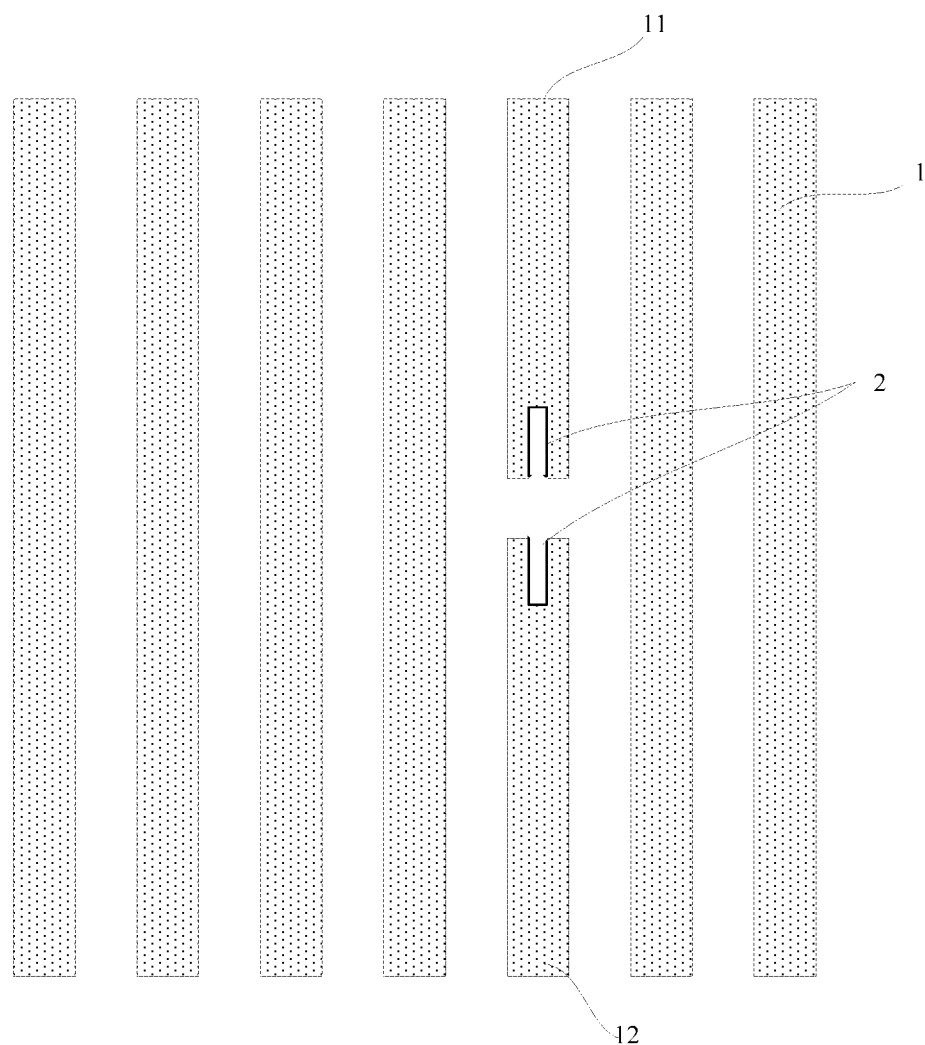
FIG. 2 is a schematic view showing a situation where a groove is formed in a substrate in an interruption region according to one embodiment of the present disclosure.
Figure 3:
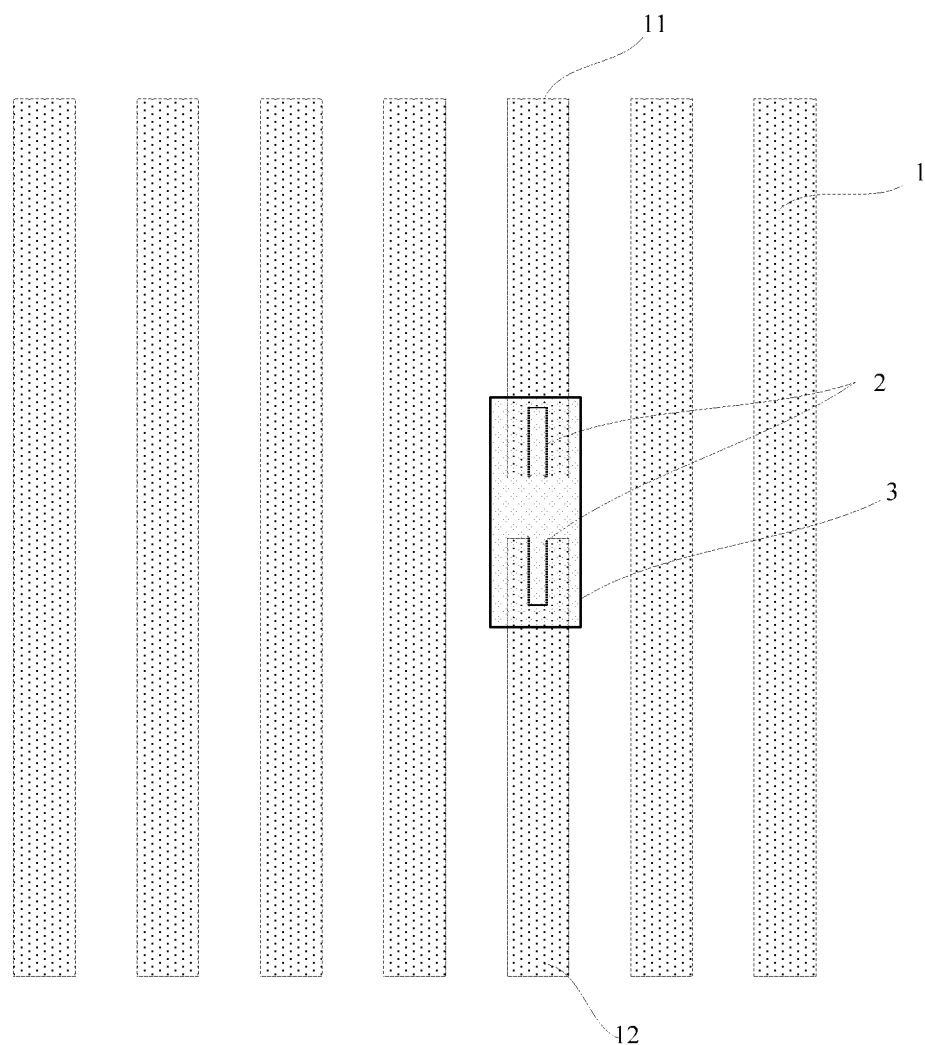
FIG. 3 is a schematic view showing a situation where a conductive material is coated according to one embodiment of the present disclosure.
Figure 4:
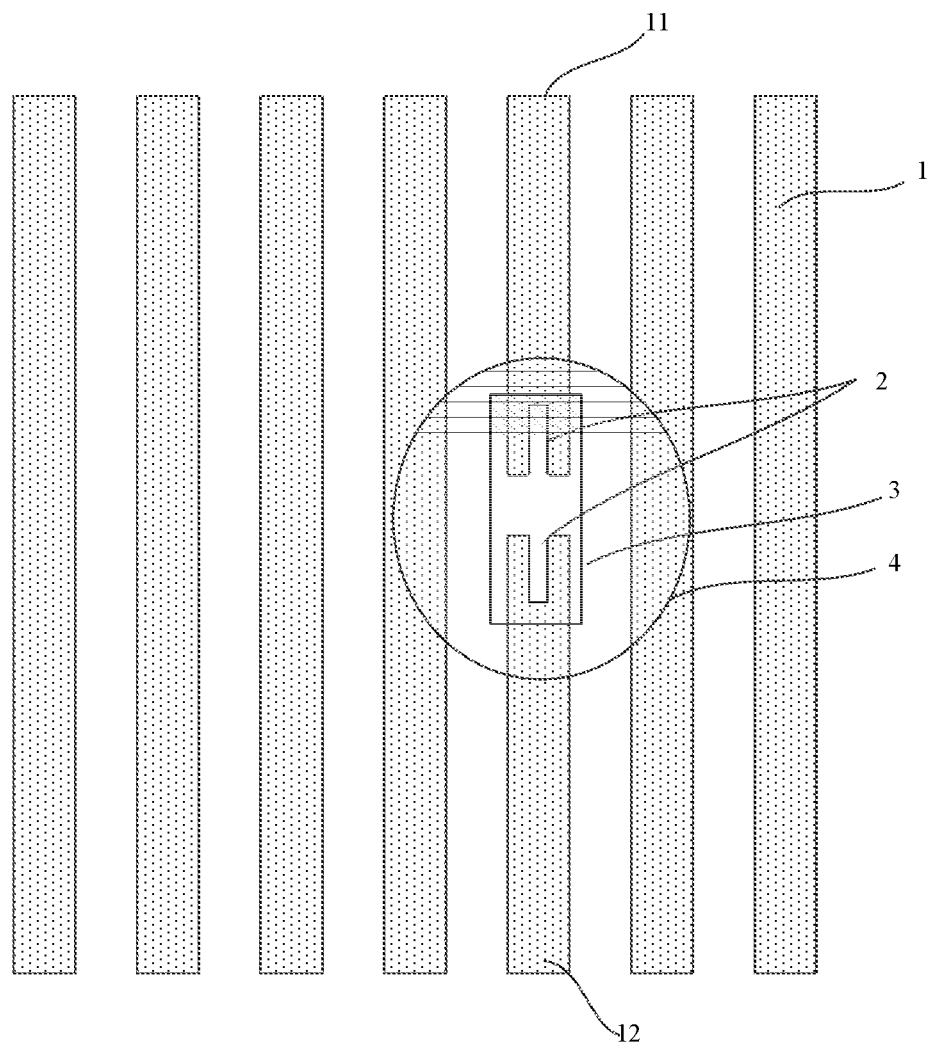
FIG. 4 is a schematic view showing a situation where an organic protection film is formed according to one embodiment of the present disclosure.

In the embodiments of the present disclosure, the substrate is a touch substrate, and the conductive pattern is a touch electrode line of the touch substrate. As shown in FIG. 1, a plurality of parallel touch electrode lines 1 is arranged on the substrate, the touch electrode lines 1 are made of a transparent conductive material ITO, one of the touch electrode lines 1 is interrupted and divided into a first conductive sub-pattern 11 and a second conductive sub-pattern 12, and a region indicated by a dotted box is the interruption region. Prior to maintaining the interruption region, the foreign matters, e.g., residual ITO and residual particles, in the interruption region are removed through laser. Next, as shown in FIG. 2, a groove 2 is formed in the substrate in the interruption region, and a depth of the groove 2 is greater than a thickness of the touch electrode line 1, i.e., the groove 2 may penetrate through the touch electrode line 1 to an interior of the base substrate. The groove 2 may be of a rectangular shape and form a cross shape together with cracks in the interruption region, so as to couple the first conductive sub-pattern 11 and the second conductive sub-pattern 12. A depth of the groove 2 may be designed according to the practical need. Next, as shown in FIG. 3, the conductive material 3, e.g., tungsten powder, silver powder or cobalt powder, is coated in the interruption region in such a manner as to not only fill the groove 2 but also exceed the region where the groove 2 is arranged and the interruption region. The region covered by the conductive material 3 is of a rectangular shape and couples the first conductive sub-pattern 11 and the second conductive sub-pattern 12, and there is a certain distance between the conductive material 3 and the surrounding touch electrodes lines 1 so as to avoid the occurrence of a short circuit with the surrounding touch electrode lines 1. Of course, the region covered by the conductive material 3 is not limited to be of a rectangular shape, and it may be of any other shapes, such as an oval shape. Then, as shown in FIG. 4, the organic protection liquid material is coated on the conductive material 3, and subjected to ultraviolet curing and then thermal curing to form the organic protection film 4, so as to firmly bond the organic protection film 4 with the base substrate and prevent the conductive material from falling off from the base substrate, thereby to increase the maintenance stability. The organic protection film 4 is insulative, and it may cover the surrounding touch electrode lines 1 without affecting the performance of the substrate. As a result, the area of the organic protection film 4 may be designed to be relatively large, so as to increase the adhesion between the organic protection film 4 and the substrate. As shown in FIG. 4, the organic protection film is of a circular shape, and a diameter of the organic protection film is 70 µm to 100 µm.

In the embodiments of the present disclosure, the conductive pattern is made of, but not limited to, the transparent conductive material, and it may also be made of metal. When the conductive pattern is made of metal, it is also able to increase the adhesion between the conductive material and the base substrate through the groove and the organic protection film, and prevent the conductive material from falling off from the base substrate in the reliability verification process, thereby to ensure the maintenance effect and improve the yield of the substrate.

In addition, in the embodiments of the present disclosure, the touch electrode line of a touch substrate is taken as an example of the conductive pattern, and through the technical solutions in the embodiments of the present disclosure, it is able to improve the maintenance reliability and the yield of the touch substrate. However, the conductive pattern is not limited to the touch electrode line of the touch substrate, and it may also be any signal line of a display substrate, such as a gate line, or a data line. At this time, through the technical solutions in the embodiments of the present disclosure, it is able to improve the maintenance reliability and the yield of the display substrate.

The present disclosure further provides in some embodiments a substrate obtained after maintaining the substrate with the interruption region through the above maintenance method. The substrate includes a base substrate, the base substrate is provided with at least one conductive pattern, and at least one of the at least one conductive pattern is interrupted and divided into a first conductive sub-pattern and a second conductive sub-pattern. The substrate further includes: a conductive material in an interruption region, the conductive material covering both the first conductive sub-pattern and the second conductive sub-pattern; and an organic protection film at a side of the conductive material away from the base substrate.

In the embodiments of the present disclosure, the conductive material is used to couple the divided parts of the conductive pattern. In addition, the organic protection film covering the conductive material is arranged at one side of the conductive material away from the base substrate. The organic protection film has stronger adhesion with the base substrate, so it is able to prevent the conductive material from falling off from the base substrate in the reliability verification process, thereby to ensure the maintenance effect and improve the yield of the substrate.

In some embodiments of the present disclosure, the conductive pattern of the substrate is made of a transparent conductive material, such as ITO. Usually, the conductive material for maintaining the interruption region is metal powder, such as tungsten powder. Due to poor bondability between ITO and the metal powder, after the maintenance is performed in interruption region through the metal powder, the metal may fall off at a maintenance point, and thereby the yield of the substrate may be adversely affected. In the embodiments of the present disclosure, the conductive material is covered by the organic protection film having strong adhesion with the base substrate, so it is able to prevent the metal at the maintenance point falling off from the base substrate, thereby to ensure the maintenance effect and improve the yield of the substrate.

The organic insulation material may be organic resin, and the conductive material for maintenance may be tungsten powder, silver powder, or cobalt powder. As compared with the conductive material, the organic insulation material has stronger adhesion with the base substrate and is not easy to fall off from the base substrate, so it is able to prevent the conductive material from falling off from the base substrate.

In order to increase the contact area between the conductive material and the base substrate as possible, the conductive material, in addition to covering the interruption region, should also exceed the interruption region, i.e., a first orthogonal projection of the interruption region onto the base substrate is arranged within a second orthogonal projection of the conductive material onto the base substrate. In some embodiments of the present disclosure, a shortest distance between an outline of the first orthogonal projection and an outline of the second orthogonal projection is greater than 2 μm, so as to ensure a sufficient contact area between the conductive material and the base substrate, thereby to prevent the conductive material from falling off from the base substrate.

In the embodiments of the present disclosure, the organic protection film is used to prevent the conductive material from falling off from the base substrate, and in order to achieve the purpose, an orthogonal projection of the conductive material onto the base substrate should be arranged within an orthogonal projection of the organic protection film onto the base substrate. Subsequent to coating the conductive material to couple the first conductive sub-pattern and the second conductive sub-pattern, an organic protection liquid material is coated on the conductive material. The organic protection liquid material is subjected to ultraviolet curing and then thermal curing to form the organic protection film. In this way, it is able to firmly bond the organic protection film to the base substrate and prevent the conductive material from falling off from the base substrate, thereby to increase the maintenance stability.

A thickness of the organic protection film is less than 1.5 μm, so as to prevent the subsequent process, e.g., the attachment of a polarizer, from being adversely affected.

An upper limit of an area of the organic protection film is determined so as to not affect an appearance of the substrate. In some embodiments of the present disclosure, the organic protection film is of a circular shape, and a diameter of the organic protection film is 70 μm to 100 μm. When the diameter of the organic protection film has the above value, the organic protection film may completely cover the maintenance region without affecting the appearance of the substrate.

In addition, the larger the contact area between the conductive material and the substrate, the greater the adhesion between the conductive material and the substrate. In order to improve the adhesion between the conductive material and the substrate, the conductive material may cover a larger area of the substrate. The substrate further includes a groove extending from the first conductive sub-pattern to the second conductive sub-pattern, and the conductive material is arranged in the groove. Due to the groove, it is able to increase the contact area between the conductive material and the substrate, so as to increase the adhesion between the conductive material and the substrate and ensure the bonding stability between the conductive material and the conductive pattern, thereby to prevent the conductive material from falling off from the base substrate due to different thermal expansion coefficients of the conductive material and the conductive pattern.

The groove extends from the first conductive sub-pattern to the second conductive sub-pattern, i.e., an orthogonal projection of the groove onto the base substrate overlaps an orthogonal projection of the first conductive sub-pattern onto the base substrate and an orthogonal projection of the second conductive sub-pattern onto the substrate. In order to increase an area of the groove and further increase the contact area between the conductive material and the substrate, the orthogonal projection of the groove onto the base substrate is a radial pattern, for example, a cross-shaped or a star-like pattern.

A width of the groove is adjusted in accordance with a line width of the conductive pattern, e.g., one third of the line width of the conductive pattern. When the width of the conductive pattern is relatively large, a plurality of parallel or crossed grooves may be formed, and each groove extends from the first conductive sub-pattern to the second conductive sub-pattern.

Subsequent to the formation of the groove in the base substrate, the groove may be filled with the conductive material to couple the first conductive sub-pattern and the second conductive sub-pattern, and a surface of the conductive material away from the base substrate and a surface of the conductive pattern away from the base substrate are located on a same plane. In this regard, after maintaining the conductive pattern through the conductive material, the surface of the conductive material away from the base substrate and the surface of the conductive pattern away from the base substrate may form a flat surface, so as to facilaite the subsequent process.

When the conductive pattern is made of a transparent conductive material, such as ITO, due to the particularity of the transparent conductive material, metal will fall off when the maintenance is performed in the interruption region. However, when the technical solution in the embodiments of the present disclosure is adopted, it is able to solve the above-mentioned problem.

In the embodiments of the present disclosure, the substrate is a touch substrate, and the conductive pattern is a touch electrode line of the touch substrate. As shown in FIG. 4, a plurality of parallel touch electrode lines 1 is arranged on the substrate, the touch electrode lines 1 are made of a transparent conductive material ITO, one of the touch electrode lines 1 is interrupted and divided into a first conductive sub-pattern 11 and a second conductive sub-pattern 12, and a region indicated by a dotted box is the interruption region. A groove 2 is formed in the substrate in the interruption region, and a depth of the groove 2 is greater than a thickness of the touch electrode line 1, i.e., the groove 2 may penetrate through the touch electrode line 1 to an interior of the base substrate. The groove 2 may be of a rectangular shape and form a cross shape together with cracks in the interruption region, so as to couple the first conductive sub-pattern 11 and the second conductive sub-pattern 12. A depth of the groove 2 may be designed according to the practical need. The conductive material 3 is coated in the interruption region in such a manner as to not only fill the groove 2 but also exceed the region where the groove 2 is arranged and the interruption region. The region covered by the conductive material 3 is of a rectangular shape and couples the first conductive sub-pattern 11 and the second conductive sub-pattern 12, and there is a certain distance between the conductive material 3 and the surrounding touch electrodes lines 1 so as to avoid the occurrence of a short circuit with the surrounding touch electrode lines 1. Of course, the region covered by the conductive material 3 is not limited to be of a rectangular shape, and it may be of any other shapes, such as an oval shape. The organic protection film 4 is arranged on the conductive material 2 and firmly bonded to the base substrate, so as to prevent the conductive material from falling off from the base substrate, thereby to increase the maintenance stability. The organic protection film 4 is insulative, and it may cover the surrounding touch electrode lines 1 without affecting the performance of the substrate. As a result, the area of the organic protection film 4 may be designed to be relatively large, so as to increase the adhesion between the organic protection film 4 and the substrate. As shown in FIG. 4, the organic protection film is of a circular shape, and a diameter of the organic protection film is 70 µm to 100 µm.

In the embodiments of the present disclosure, the conductive pattern is made of, but not limited to, the transparent conductive material, and it may also be made of metal. When the conductive pattern is made of metal, it is also able to increase the adhesion between the conductive material and the base substrate through the groove and the organic protection film, and prevent the conductive material from falling off from the base substrate in the reliability verification process, thereby to ensure the maintenance effect and improve the yield of the substrate.

In addition, in the embodiments of the present disclosure, the touch electrode line of a touch substrate is taken as an example of the conductive pattern, and through the technical solutions in the embodiments of the present disclosure, it is able to improve the maintenance reliability and the yield of the touch substrate. However, the conductive pattern is not limited to the touch electrode line of the touch substrate, and it may also be any signal line of a display substrate, such as a gate line, or a data line. At this time, through the technical solutions in the embodiments of the present disclosure, it is able to improve the maintenance reliability and the yield of the display substrate.

The present disclosure further provides in some embodiments a display device, which includes the above-mentioned substrate.

The present disclosure further provides in some embodiments a display device including the above-mentioned display panel. The display device may include, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, flat-panel computer, television, wearable electronic device or navigator.

It should be appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A maintenance method for a substrate, wherein the substrate comprises a base substrate, the base substrate is provided with at least one conductive pattern, and at least one of the at least one conductive pattern is interrupted and divided into a first conductive sub-pattern and a second conductive sub-pattern, wherein the maintenance method comprises:
   coating a conductive material in an interruption region in such a manner as to cover both the first conductive sub-pattern and the second conductive sub-pattern; and
   coating an organic insulation material at a side of the conductive material away from the base substrate, and curing the organic insulation material to form an organic protection film covering the conductive material, wherein the organic protection film is of a circular shape, and a diameter of the organic protection film is 70 μm to 100 μm.

2. The maintenance method according to claim 1, wherein prior to coating the conductive material in the interruption region, the maintenance method further comprises forming a groove in a surface of the substrate in the interruption region, and the groove extends from the first conductive sub-pattern to the second conductive sub-pattern, wherein the coating the conductive material in the interruption region comprises filling the groove with the conductive material.

3. The maintenance method according to claim 1, wherein prior to coating the conductive material in the interruption region, the maintenance method further comprises removing foreign matters in the interruption region.

4. A substrate, comprising a base substrate, wherein the base substrate is provided with at least one conductive pattern, and at least one of the at least one conductive pattern is interrupted and divided into a first conductive sub-pattern and a second conductive sub-pattern, wherein the substrate further comprises:
a conductive material in an interruption region and covering both the first conductive sub-pattern and the second conductive sub-pattern; and
an organic protection film at a side of the conductive material away from the base substrate,
wherein the organic protection film is of a circular shape, and a diameter of the organic protection film is 70 μm to 100 μm.

5. The substrate according to claim 4, wherein an orthogonal projection of the conductive material onto the base substrate is arranged within an orthogonal projection of the organic protection film onto the base substrate.

6. The substrate according to claim 4, wherein a first orthogonal projection of the interruption region onto the base substrate is arranged within a second orthogonal projection of the conductive material onto the base substrate.

7. The substrate according to claim 6, wherein a shortest distance between an outline of the first orthogonal projection and an outline of the second orthogonal projection is greater than 2 μm.

8. The substrate according to claim 4, wherein a surface of the conductive material away from the base substrate and a surface of the conductive pattern away from the base substrate are located on a same plane.

9. The substrate according to claim 4, further comprising a groove extending from the first conductive sub-pattern to the second conductive sub-pattern, wherein the conductive material is filled in the groove.

10. The substrate according to claim 9, wherein an orthogonal projection of the groove onto the base substrate is a radial pattern.

11. The substrate according to claim 4, wherein the conductive pattern is made of a transparent conductive material, and the conductive material is tungsten powder, silver powder, or cobalt powder.

12. The substrate according to claim 11, wherein the substrate is a touch substrate, and the conductive pattern is a touch electrode line.

13. A display device, comprising the substrate according to claim 4.

14. The display device according to claim 13, wherein an orthogonal projection of the conductive material onto the base substrate is arranged within an orthogonal projection of the organic protection film onto the base substrate.

15. The display device according to claim 13, wherein a first orthogonal projection of the interruption region onto the base substrate is arranged within a second orthogonal projection of the conductive material onto the base substrate.

16. The display device according to claim 15, wherein a shortest distance between an outline of the first orthogonal projection and an outline of the second orthogonal projection is greater than 2 μm.

17. The display device according to claim 13, wherein a surface of the conductive material away from the base substrate and a surface of the conductive pattern away from the base substrate are located on a same plane.

18. The display device according to claim 13, wherein the substrate further comprises a groove extending from the first conductive sub-pattern to the second conductive sub-pattern, wherein the conductive material is filled in the groove.

* * * * *